(12) United States Patent
Wright et al.

(10) Patent No.: US 6,888,688 B2
(45) Date of Patent: May 3, 2005

(54) OPTOELECTRONIC DISPLAY DEVICE

(75) Inventors: Jeffrey Peter Wright, Edinburgh (GB); David Paul Steven, Edinburgh (GB)

(73) Assignee: Microemissive Displays Limited, Edinburgh (GB)

( * ) Notice: Subject to any disclaimer, the term of this patent is extended or adjusted under 35 U.S.C. 154(b) by 0 days.

(21) Appl. No.: 10/276,951
(22) PCT Filed: May 10, 2001
(86) PCT No.: PCT/GB01/02064
§ 371 (c)(1), (2), (4) Date: Nov. 5, 2002
(87) PCT Pub. No.: WO01/86694
PCT Pub. Date: Nov. 15, 2001

(65) Prior Publication Data
US 2003/0123158 A1 Jul. 3, 2003

(30) Foreign Application Priority Data
May 10, 2000 (GB) .............................. 0011297

(51) Int. Cl.[7] .............................................. G02B 27/02
(52) U.S. Cl. .................................... 359/802; 359/803
(58) Field of Search ............................. 359/642, 796, 359/802, 803

(56) References Cited

U.S. PATENT DOCUMENTS

| H000423 | H | * | 2/1988 | Mohon et al. ............... 359/742 |
| 5,155,615 | A | | 10/1992 | Tagawa ....................... 359/213 |
| 5,325,278 | A | | 6/1994 | Tortola et al. ............... 362/109 |
| 5,633,762 | A | * | 5/1997 | Richard ....................... 359/817 |
| 5,699,073 | A | | 12/1997 | Lebby et al. ................... 345/82 |
| 6,067,459 | A | * | 5/2000 | Lincoln et al. .............. 455/566 |
| 6,151,172 | A | * | 11/2000 | Ferraro ....................... 359/802 |
| 6,222,686 | B1 | * | 4/2001 | Richard ....................... 359/802 |
| 6,275,333 | B1 | * | 8/2001 | Shaffer ........................ 359/440 |
| 6,389,268 | B1 | * | 5/2002 | Snyder ....................... 455/90.1 |
| 6,452,577 | B1 | * | 9/2002 | Gale et al. ..................... 345/87 |

FOREIGN PATENT DOCUMENTS

| EP | 0 147 027 A2 | 7/1985 |
| EP | 0 539 699 A2 | 5/1993 |
| EP | 0 838 715 A1 | 4/1998 |
| GB | 2 095 454 A | 9/1982 |
| GB | 2 298 759 A | 9/1996 |
| WO | WO 97/14072 | 4/1997 |

* cited by examiner

Primary Examiner—Scott J. Sugarman
Assistant Examiner—William Choi
(74) Attorney, Agent, or Firm—Howson and Howson

(57) ABSTRACT

An optoelectronic display device comprises an organic light emitting diode microdisplay 1 and a viewing convex lens 2 arranged at a distance from the microdisplay which may be less than, equal to or greater than the focal length of the lens.

13 Claims, 1 Drawing Sheet

OPTOELECTRONIC DISPLAY DEVICE

This invention relates to an optoelectronic display device.

Small sized high resolution displays have been manufactured using a number of flat panel display technologies, and also for cathode ray tube (CRT) technology. These have been developed for use in a number of different products, which require different performance profiles from the display. Important considerations often include the cost of the display, the power consumption, the resolution, contrast, brightness and size of display.

The difficulty in obtaining acceptable levels of all these, for small, and very large, sized displays has seen the development recently of a new class of optoelectronic display devices. These devices couple a high resolution display with an optical system to create an image for viewing that is larger than the physical size of the display. This type of display is often referred to as a microdisplay, or miniature display.

Typically the microdisplay has a diagonal of less (often much less) than 6 cm. The displays typically have an active matrix driving system to control the pixel arrays, and to lower power consumption. The resolution of the displays varies from 160×160 pixels up to almost 2000×2000, with the displays often constructed directly on top of amorphous silicon thin film transistors (TFTs), polysilicon TFTs on glass, or crystalline silicon CMOS wafers.

Many different types of liquid crystal display have been manufactured in this way, and several types of digital micromirror devices, inorganic electroluminescent, and organic light emitting diode devices, have been or are being developed. This gives rise to a range of displays that are either transmissive, reflective, or emissive in nature. The display cost, power consumption, resolution, contrast, brightness and size affect what type of market and product they are used for.

The display devices are known to be used in three different configurations.

The first method is projection. The display device is combined with optical components and used to project an image onto a screen some distance away. The image created on the display is observed by the viewer(s) on the screen, and is typically a very large image. This mode of use is favourable for displays that work in a reflective or transmissive mode. This is because they are used in conjunction with suitably bright light sources needed to project an image over some distance.

The second method is referred to as a virtual display or as near to eye mode. This sees the display device combined with optics, suitable light sources if required (depending on the mode of operation), and held close to the viewers eye, normally somewhere nearer than 15 centimeters. The viewer sees what is typically termed a virtual image, which appears much larger than the physical size of the display. The image may appear to be 10–20 times the physical size of the display. This configuration is typically used for digital camera viewfinder applications, headset applications, and has been postulated for use in mobile communication products, personal internet browser devices, and toys amongst others. This mode of operation is suitable for displays working in emissive, transmissive, or reflective mode.

The advantage of virtual mode is that a high resolution colour image can be viewed from products that are physically small, and the display is much lower power and lower cost than a display of the size of the virtual image would be.

In the third configuration, the display is viewed directly without the aid of optical lenses to increase the perceived image size. This is known as direct view. For application of high resolution displays in products such as mobile telephones, this method has the advantage of allowing the images to be viewed comfortably from approximately arms length, somewhere between 25 and 50 cm from the viewer's eyes. This is also the manner of viewing displays with which most people are familiar.

However, the disadvantage is that the viewed image never appears larger than the physical size of the display. In direct view mode, there is a limitation to the resolution that the human eye can perceive which is related to the size of a display and the distance it is viewed from. Therefore for comfortable viewing from 25 to 50 cm distance a display must have a display diagonal size of approximately 4 cm or larger. For a display with a diagonal of 4 cm, higher resolution than 320×240 pixels will not be perceived by the human eye.

Direct view displays of this size and resolution have mostly been too expensive and used too much power to facilitate their integration into a range of consumer products.

As the displays are typically built on substrates that are silicon wafers, or house silicon TFTs, increasing the physical size of the display greatly increases the cost and overall power consumption.

The present invention provides an optoelectronic display device comprising an organic light emitting diode microdisplay and a convex viewing lens arranged at a distance therefrom.

The device of the invention is intended to replace standard direct view displays and differs from them in that it does not have a truly flat construction. The suitably sized lens serves as the viewing surface. The lens could be positioned at a distance from the microdisplay less than or equal to the focal length of the lens. With the lens positioned at the focal length distance in front of the microdisplay a maximum magnification is obtained. If the lens is positioned nearer to the microdisplay, less magnification will occur for the virtual image. The lens can be further than the focal length distance from the microdisplay for an inverted real image to be seen on the surface of the lens. By placing the microdisplay upside down, an upright image will be seen by the viewer.

Preferably, the physical size of the display is magnified by a factor of approximately 2 or greater, and advantageously the magnification is up to approximately 5 times. This enlarged image is viewed from the surface of the lens, with the device conveniently held somewhere between 25 and 50 cm from the viewer's eyes.

The main advantage of this type of display device is that by keeping the size of the silicon substrate small and magnifying the image by a factor between 2 and 5 times, the associated cost is much lower than creating a display 2 to 5 times as large. The power consumption is also less than that of a direct view display of a similar size to the magnified image. In OLED displays the light output can be increased by a factor between 2 and 5 times without a linearly corresponding increase in power consumption.

A further advantage of the invention is that it creates an affordable active matrix colour display of a size that is suitable for incorporation into mobile telephones and similar products.

Preferably, the lens is a lightweight plastic microfresnel lens, in order to remove chromatic aberrations and to make possible the construction of a relatively lightweight display device.

The viewing lens does not necessarily need to be placed directly above the microdisplay. To reduce the overall depth of the display device, that is the distance from the microdisplay to the viewing lens it is also possible to fold the optical path, using appropriate additional optics. This may be useful when using the display device in an application or product which has set dimensions. By folding the optical path, one can reduce the overall space occupied by the display device.

In order that the invention may be more readily understood, reference will now be made, by way of example only, to the accompanying drawings, in which.

Figure 1:
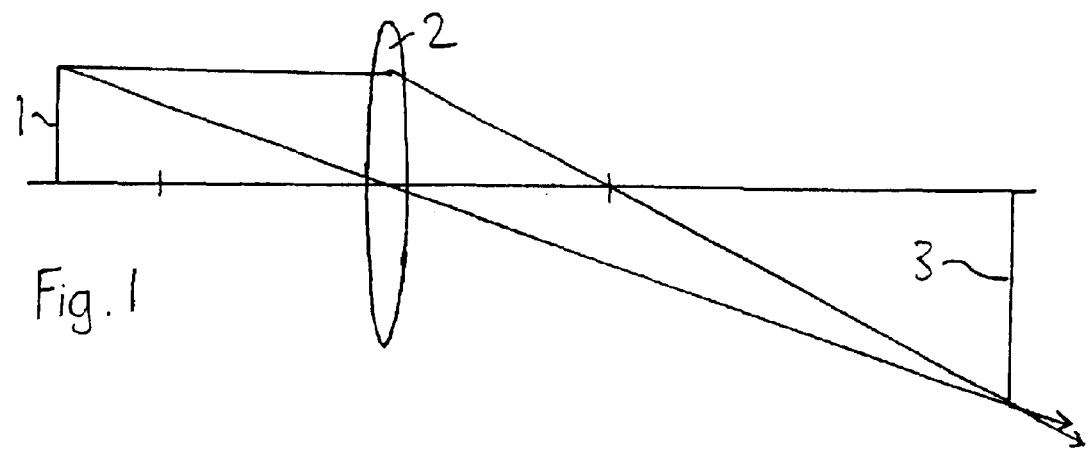
FIG. 1 is a schematic diagram of a display device according to an embodiment of the invention.

FIG. 1 shows a microdisplay 1, with a convex lens 2 arranged a few centimeters, but at a distance greater than the focal length of the lens, in front of the microdisplay. A viewer views the device from a distance of 30 to 50 cm from the lens 2. The viewer sees a magnified real image 3 of the microdisplay.

Figure 2:
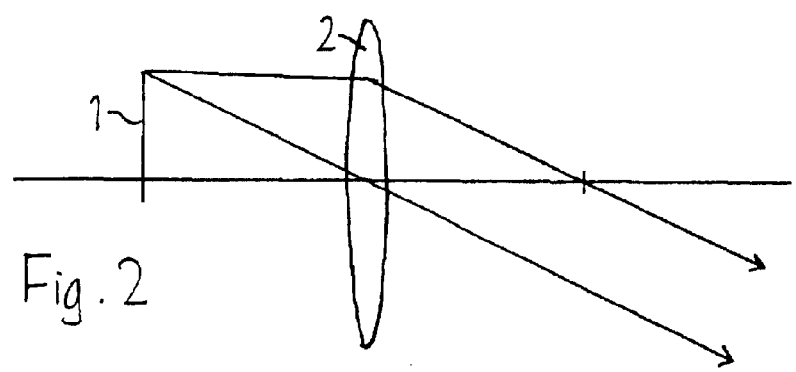
FIG. 2 is a schematic diagram of a display device according to another embodiment.

FIG. 2 shows an alternative arrangement in which the distance from the microdisplay 1 to the lens 2 is equal to the focal length of the lens. The image is at infinity.

Figure 3:
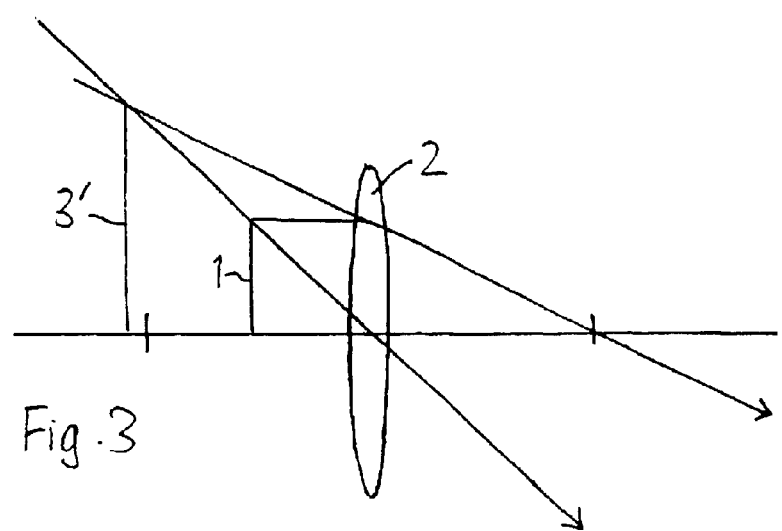
FIG. 3 is a schematic diagram of a display device according to yet another embodiment.

FIG. 3 shows an arrangement in which the microdisplay 1 is closer to the lens 2 than the focal length of the latter. The image 3' is virtual and is formed on the same side of the lens 2 as the microdisplay 1.

What is claimed is:

1. A direct view optoelectronic display device, comprising an organic light emitting diode microdisplay and a viewing convex, lightweight, plastic, microfresnel lens arranged at a distance therefrom, a physical size of the display is magnified by a factor of no greater than approximately 5 and said distance is less than or equal to the focal length of the lens.

2. A device according to claim 1, wherein the physical size of the display is magnified by a factor of 2 or greater.

3. A device according to claim 2, further comprising optical means for reducing the distance from the microdisplay to the viewing lens by folding the optical path.

4. A device according to claim 1, further comprising optical means for reducing the distance from the microdisplay to the viewing lens by folding the optical path.

5. A device according to claim 1, wherein said lens magnifies an image of said microdisplay by a factor between 2 to 5 times and serves as a viewing surface for viewing the magnified image, and wherein the magnified image can be viewed on said viewing surface when the device is held between about 25 to 50 cm from a viewer's eye.

6. A direct view optoelectronic display device, comprising an organic light emitting diode microdisplay and a viewing convex, lightweight, plastic, microfresnel lens arranged at a distance therefrom, a physical size of the display is magnified by a factor of no greater than approximately 5 and said distance is greater than the focal length of the lens to give an inverted real image.

7. A device according to claim 6, wherein the physical size of the display is magnified by a factor of 2 or greater.

8. A device according to claim 7, further comprising optical means for reducing the distance from the microdisplay to the viewing lens by folding the optical path.

9. A device according to claim 6, further comprising optical means for reducing the distance from the microdisplay to the viewing lens by folding the optical path.

10. A device according to claim 6, wherein said lens magnifies an image of said microdisplay by a factor between 2 to 5 times and serves as a viewing surface for viewing the magnified image, and wherein the magnified image can be viewed on said viewing surface when the device is held between about 25 to 50 cm from a viewer's eye.

11. A display device, comprising a direct view optoelectronic display device having an organic light emitting diode microdisplay and a viewing convex, lightweight, plastic, microfresnel lens arranged at a distance therefrom, said lens magnifies an image of said microdisplay by a factor between 2 to 5 times and serves as a viewing surface for viewing the magnified image from a viewing distance from a viewer's eye of 25 to 50 cm.

12. A device according to claim 11, wherein said distance between said microdisplay and said lens is greater than a focal length of the lens so that said magnified image is an inverted real image.

13. An optoelectronic display device, comprising an organic light emitting diode microdisplay and a viewing convex lens arranged at a distance therefrom, said distance is greater than the focal length of the lens to give an inverted real image.

* * * * *